(12) United States Patent
Rokos

(10) Patent No.: US 11,211,898 B2
(45) Date of Patent: Dec. 28, 2021

(54) OSCILLATOR CIRCUITS

(71) Applicant: eoSemi Limited, Cheshire (GB)

(72) Inventor: Hedley Rokos, Cheshire (GB)

(73) Assignee: eoSemi Limited, Cheshire (GB)

( * ) Notice: Subject to any disclaimer, the term of this patent is extended or adjusted under 35 U.S.C. 154(b) by 0 days.

(21) Appl. No.: 16/936,929

(22) Filed: Jul. 23, 2020

(65) Prior Publication Data

US 2020/0358399 A1    Nov. 12, 2020

Related U.S. Application Data

(63) Continuation of application No. PCT/GB2019/050184, filed on Jan. 23, 2019.

(30) Foreign Application Priority Data

Jan. 24, 2018  (GB) .................................. 1801161

(51) Int. Cl.
*H03B 5/36* (2006.01)
*H03F 3/16* (2006.01)

(52) U.S. Cl.
CPC ............. *H03B 5/364* (2013.01); *H03B 5/368* (2013.01); *H03F 3/16* (2013.01); *H03B 2200/004* (2013.01)

(58) Field of Classification Search
CPC ... H03B 5/30; H03B 5/32; H03B 5/36; H03B 5/362; H03B 5/364; H03B 5/366; H03B 5/368; H03B 2200/004
USPC .......................... 331/116 FE, 116 R, 154, 158
See application file for complete search history.

(56) References Cited

U.S. PATENT DOCUMENTS

| 3,868,597 A | * | 2/1975 | Gollinger | ................... G04F 5/06 |
| | | | | 331/116 FE |
| 3,939,644 A | * | 2/1976 | Wolf | ......................... G04C 3/14 |
| | | | | 368/76 |
| 4,376,918 A | * | 3/1983 | Masuda | ................ H03K 3/3545 |
| | | | | 331/116 FE |

(Continued)

FOREIGN PATENT DOCUMENTS

| DE | 3223338 | 1/1984 |
| EP | 0905877 | 3/1999 |

(Continued)

*Primary Examiner* — Levi Gannon
(74) *Attorney, Agent, or Firm* — Levine Bagade Han LLP

(57) ABSTRACT

Disclosed is an integrated circuit amplifier for use in a crystal oscillator. The circuit amplifier comprises a transistor; a voltage dependent capacitance circuit; and a node. The voltage dependent capacitance circuit comprises a device with a voltage dependent capacitance and a bias circuit. The node is connected to a terminal of the transistor and the integrated circuit amplifier is configured such that an intrinsic capacitance of the transistor is dependent on the mean voltage at the node. The node is connected to a terminal of the voltage dependent capacitance circuit and the integrated circuit amplifier is configured such that an effective capacitance of the node is dependent on the intrinsic capacitance of the transistor and the voltage dependent capacitance of said device. When in use, the voltage dependent capacitance circuit reduces the amount of change of the effective capacitance of the node when the mean voltage at the node changes.

20 Claims, 4 Drawing Sheets

(56) References Cited

U.S. PATENT DOCUMENTS

| | | | | |
|---|---|---|---|---|
| 4,387,350 | A * | 6/1983 | Bessolo | G04G 19/00 |
| | | | | 331/116 FE |
| 5,929,715 | A * | 7/1999 | Nakamiya | G04F 5/06 |
| | | | | 331/62 |
| 6,320,473 | B1 * | 11/2001 | Leuschner | H03B 5/06 |
| | | | | 331/116 FE |
| 6,933,797 | B2 * | 8/2005 | Miyahara | H03B 5/04 |
| | | | | 331/158 |
| 8,854,147 | B2 * | 10/2014 | Lin | H03B 5/362 |
| | | | | 331/116 FE |
| 2003/0112080 | A1 | 6/2003 | Amiot et al. | |
| 2006/0214740 | A1 * | 9/2006 | Sheng | H03B 5/364 |
| | | | | 331/158 |
| 2006/0255871 | A1 * | 11/2006 | Kamiya | H03B 5/368 |
| | | | | 331/158 |
| 2015/0116043 | A1 * | 4/2015 | Itasaka | H03B 5/362 |
| | | | | 331/62 |
| 2015/0180410 | A1 * | 6/2015 | Yamamoto | H03B 5/04 |
| | | | | 331/70 |
| 2018/0145694 | A1 * | 5/2018 | Yamamoto | H03B 5/04 |

FOREIGN PATENT DOCUMENTS

| | | |
|---|---|---|
| JP | S59 168704 | 9/1984 |
| JP | S60-190004 | 9/1985 |
| JP | H10308632 | 11/1998 |
| JP | 2002-198733 | 7/2002 |
| WO | WO 2019/145707 | 8/2019 |

* cited by examiner

PRIOR ART

OSCILLATOR CIRCUITS

CROSS-REFERENCE TO RELATED APPLICATIONS

This application is a continuation International Patent Application Number PCT/GB2019/050184 filed Jan. 23, 2019, which claims the benefit of priority to GB 1801161.9 filed Jan. 24, 2018, the contents of which are incorporated herein by reference in their entireties.

BACKGROUND OF THE INVENTION

Field

The field of the invention is the provision of circuits for use in a crystal oscillator. Embodiments provide new designs of semiconductor amplifier circuits with improved performance over known semiconductor amplifier circuits.

Background

Quartz crystal oscillators are used as frequency references. They are used in a wide range of applications, such as precision timing, navigation, radio, telecommunications and the clocking of microprocessors. There are a number of different oscillator implementations, that differ in size and complexity, for providing an oscillator with appropriate precision for a particular application.

The most precise applications that are supported by quartz oscillators use relatively large, low-frequency crystals in a tightly temperature-controlled environment together with complex oscillation-maintaining circuitry. These oven controlled crystal oscillators, OCXOs, can be designed with differing precisions and any of the use of smaller crystals, relaxation of temperature isolation and simplification of the oscillator electronics/circuitry will reduce costs but degrade performance.

The next range of precision is typically provided by temperature compensated crystal oscillators, TCXOs. For such oscillators, the known temperature-variation of the natural oscillation frequency is used as the input to correction circuitry. The highest performance TCXOs are well into the historical range of OCXOs, and lower-performance OCXOs can be cheaper to manufacture than the higher-performance TCXOs but will have larger power dissipation.

Other classes of crystal oscillator include simple crystal oscillators, SXOs, which are referred to as SPXOs when sold as a pre-packaged devices. Applications for these include modestly-precise stand-alone timing and short-term stable references. There are also relatively simple customer tuneable oscillators for use as electronic flywheels. The tuning control for these oscillators is usually a voltage input and they are generally known as voltage controlled crystal oscillators, VCXOs.

For all oscillator designs, there is generally a compromise between the precision and other performance characteristics of the oscillator, and the cost and/or complexity of the oscillator. For a given cost and/or complexity of oscillator, there is a general need to improve the performance of the oscillator.

BRIEF SUMMARY OF THE INVENTION

Summary of Invention

According to a first aspect of the invention, there is provided an integrated circuit amplifier for use in a crystal oscillator, the integrated circuit amplifier comprising: a transistor; a voltage dependent capacitance circuit, wherein the voltage dependent capacitance circuit comprises a device with a voltage dependent capacitance and a bias circuit of the voltage dependent capacitance; and a node; wherein the node is connected to a terminal of the transistor and the integrated circuit amplifier is configured such that an intrinsic capacitance of the transistor is dependent on the mean voltage at the node; wherein the node is also connected to a terminal of the voltage dependent capacitance circuit and the integrated circuit amplifier is configured such that an effective capacitance of the node is dependent on both the intrinsic capacitance of the transistor and the voltage dependent capacitance of said device; and wherein, in use, the voltage dependent capacitance circuit reduces the amount of change of the effective capacitance of the node when the mean voltage at the node changes.

Preferably, the bias circuit is arranged to control the voltage dependent capacitance of said device in dependence on the mean voltage at the node.

Preferably, the device with a voltage dependent capacitance is a varactor or a transistor.

Preferably, the device with a voltage dependent capacitance is any device for providing a voltage dependent capacitance.

Preferably, the bias circuit is arranged to control the voltage dependent capacitance of the device such that, in use, the voltage dependent capacitance of the device substantially minimizes the amount of change of the effective capacitance of the node when the mean voltage at the node changes.

Preferably, the integrated circuit amplifier is configured to supply a bias current to the transistor and, in use, an oscillation amplitude of the voltage at the node is restricted due to the supply of said bias current being current starved.

Preferably, the node is, or is connected to, an output terminal of the integrated circuit amplifier, wherein the output terminal arranged to provide a connection to a crystal of a crystal oscillator.

Preferably, the node is connected to a first terminal of the transistor and the integrated circuit amplifier further comprises: a current source with a first terminal connected to the node and a second terminal connected to a second terminal of the transistor; a first capacitor with a first terminal connected to a third terminal of the transistor and a second terminal connected to the second terminal of the transistor; and a second capacitor with a first terminal connected to the node and a second terminal connected to the second terminal of the transistor; wherein the third terminal of the transistor is, or is connected to, a second output terminal of the integrated circuit amplifier, wherein the second output terminal arranged to provide a connection to a crystal of a crystal oscillator.

Preferably, the transistor is a BJT.

Preferably: the first terminal of the transistor is the collector terminal of the transistor; the second terminal of the transistor is the emitter terminal of the transistor; and the third terminal of the transistor is the base terminal of the transistor.

Preferably, the transistor is a MOSFET.

Preferably: the first terminal of the transistor is the drain terminal of the transistor; the second terminal of the transistor is the source terminal of the transistor; and the third terminal of the transistor is the gate terminal of the transistor.

Preferably, the transistor is a first transistor, the node is connected to a first terminal of the first transistor, and the integrated circuit amplifier further comprises: a current source; a second transistor, wherein a first terminal of the second transistor is connected to a terminal of the current source, a second terminal of the second transistor is connected to the node and a third terminal of the second transistor is connected to a third terminal of the first transistor; a first capacitor with a first terminal connected to the third terminal of the first transistor and a second terminal connected to the terminal of the current source; a second capacitor with a first terminal connected to the third terminal of the first transistor and a second terminal connected to the second terminal of the first transistor; a second output terminal of the integrated circuit amplifier, wherein the second output terminal is arranged to provide a connection to a crystal of a crystal oscillator, and the second output terminal is connected to the third terminal of the first transistor; a third capacitor with a first terminal connected to the first terminal of the second transistor and a second terminal connected to the node; and a fourth capacitor with a first terminal connected to the node and a second terminal connected to the second terminal of the first transistor; wherein said connection between the node and the voltage dependent capacitance circuit is a connection to an input of the voltage dependent capacitance circuit, and an output of the voltage dependent capacitance circuit is connected to the second terminal of the first transistor; wherein the bulk of the first transistor is connected to a ground terminal; wherein the bulk of the second transistor is biased by a DC voltage relative to the ground terminal; and wherein the integrated circuit amplifier optionally further comprises a fifth capacitor, wherein a first terminal of the fifth capacitor is connected to a first terminal of the second transistor, and a second terminal of the fifth capacitor is connected to the second terminal of the first transistor.

Preferably, the transistor is a first transistor, the node is connected to a first terminal of the first transistor, and the integrated circuit amplifier further comprises: a DC power supply with a positive terminal and a negative terminal; a first resistor with a first terminal and a second terminal, wherein the first terminal of the first resistor is connected to the positive terminal of the DC power supply, wherein the first resistor is optionally a variable resistor; a second resistor with a first terminal and a second terminal, wherein the first terminal of the second resistor is connected to a second terminal of the first resistor and the second terminal of the second resistor is connected to the negative terminal of the DC power supply, wherein the second resistor is optionally a variable resistor; a second transistor, wherein a first terminal of the second transistor is connected to the second terminal of the first resistor, a second terminal of the second transistor is connected to the node and a third terminal of the second transistor is connected to a third terminal of the first transistor; a first capacitor with a first terminal connected to the third terminal of the first transistor and a second terminal connected to the second terminal of the first resistor; a second capacitor with a first terminal connected to the third terminal of the first transistor and a second terminal connected to the second terminal of the first transistor; a second output terminal of the integrated circuit amplifier, wherein the second output terminal is arranged to provide a connection to a crystal of a crystal oscillator, and the second output terminal is connected to the third terminal of the first transistor; a third capacitor with a first terminal connected to the first terminal of the second transistor and a second terminal connected to the node; and a fourth capacitor with a first terminal connected to the node and a second terminal connected to the second terminal of the first transistor; wherein the bulk of the first transistor is connected to the negative terminal of the DC power supply; and wherein the bulk of the second transistor is connected to the positive terminal of the DC power supply.

Preferably, the transistor is a first transistor, the node is connected to a first terminal of the first transistor, and the integrated circuit amplifier further comprises: a DC power supply with a positive terminal and a negative terminal; a first current source with a first terminal connected to the positive terminal of the DC power supply; a second current source with a first terminal connected to a second terminal of the first transistor and a second terminal connected to the negative terminal of the DC power supply; a second transistor, wherein a first terminal of the second transistor is connected to a second terminal of the first current source, a second terminal of the second transistor is connected to the node and a third terminal of the second transistor is connected to a third terminal of the first transistor; a first capacitor with a first terminal connected to the third terminal of the first transistor and a second terminal connected to the second terminal of the first current source; a second capacitor with a first terminal connected to the third terminal of the first transistor and a second terminal connected to the second terminal of the first transistor; a second output terminal of the integrated circuit amplifier, wherein the second output terminal is arranged to provide a connection to a crystal of a crystal oscillator, and the second output terminal is connected to the third terminal of the first transistor; a third capacitor with a first terminal connected to the first terminal of the second transistor and a second terminal connected to the node; and a fourth capacitor with a first terminal connected to the node and a second terminal connected to the second terminal of the first transistor; wherein the bulk of the first transistor is connected to the negative terminal of the DC power supply; and wherein the bulk of the second transistor is connected to the positive terminal of the DC power supply.

Preferably, integrated circuit amplifier further comprises one or more of: a third resistor with a first terminal connected to the node and a second terminal connected to the second output terminal; a capacitor connected between the second terminal of the first transistor and the negative terminal of the DC power supply, wherein the capacitor is optionally a tuneable capacitor; a capacitor connected between the first terminal of the second transistor and the negative terminal of the DC power supply, wherein the capacitor is optionally a tuneable capacitor; and a capacitor connected between a first terminal of the second transistor and the second terminal of the first transistor, wherein the capacitor is optionally a tuneable capacitor.

Preferably, the first transistor and second transistor are arranged in a complementary configuration.

Preferably, the first transistor and second transistor are MOSFETs.

Preferably: the first terminal of the first transistor is a drain terminal; the second terminal of the first transistor is a source terminal; the third terminal of the first transistor is a gate terminal; the first terminal of the second transistor is a source terminal; the second terminal of the second transistor is a drain terminal; and the third terminal of the second transistor is a gate terminal.

Preferably, the first transistor and second transistor are BJTs.

Preferably, one or more of the connections are indirect connections and comprise one or more other components, such as resistors.

According to a second aspect of the invention, there is provided a crystal oscillator comprising the circuit according to the first aspect; and a crystal.

According to a third aspect of the invention, there is provided an integrated circuit amplifier for use in a crystal oscillator, the integrated circuit amplifier comprising: a first transistor; a second transistor, wherein the second transistor is complementary to the first transistor; a node that is connected to both a terminal of the first transistor and a terminal of the second transistor; a current source arranged to supply at least part of a bias current to at least one of the first and second transistors, wherein the oscillation amplitude of the voltage at the node is dependent on said bias current; wherein the integrated circuit amplifier is configured so that, in use, an oscillation amplitude of the voltage at the node is restricted due to the supply of said bias current being current starved.

Preferably, the integrated circuit amplifier is configured so that the first and second transistors are in a configuration of the extended Colpitts family; and/or, optionally, the transistors are arranged in an inverter configuration, such as a Pierce configuration.

Preferably, the transistors are designed so that the change gain of the first transistor with respect to the oscillation current and the change gain of the second transistor with respect to the oscillation current have substantially the same magnitude and are the inverse of each other.

Preferably, the transistors and/or related bias circuits are designed so that, in use, variation of at least one of the bias voltages causes changes in the parasitic capacitances that are of substantially the same magnitude and opposite polarity.

Preferably, the transistors are designed so that the change gain of the first transistor with respect to the operating current and the change gain of the second transistor with respect to the operating current have substantially the same magnitude and are the inverse of each other.

Preferably, the transistors are designed so that, in use, they have substantially the same capacitances as each other.

Preferably, either: the first transistor and second transistor are BJTs and arranged in a common-collector configuration; or the first transistor and second transistor are MOSFETs and arranged in a common-drain configuration.

Preferably, either: the first transistor and second transistor are BJTs and arranged in a common-base configuration; or the first transistor and second transistor are MOSFETs and arranged in a common-gate configuration.

Preferably, either: the first transistor and second transistor are BJTs and arranged in a common-emitter configuration; or the first transistor and second transistor are MOSFETs and arranged in a common-source configuration.

Preferably, the integrated circuit amplifier further comprises a passive bias circuit; wherein, in use, the operating voltages and/or currents are dependent on the passive bias circuit.

Preferably, the integrated circuit amplifier further comprises an active bias circuit; wherein, in use, the active bias circuit is configured to control the mean voltage at the node of the integrated circuit amplifier.

Preferably, the node is a first node that is, or is connected to, a first output terminal for connecting to the crystal of a crystal oscillator, and the first node is connected to a second terminal of the first transistor, wherein the integrated circuit amplifier further comprises: a second node that is, or is connected to, a second output terminal for connecting to the crystal of a crystal oscillator, and the second node is connected to a third terminal of the first transistor; a first capacitor with a first terminal, that is connected to a first terminal of the first transistor, and a second terminal, that is connected to the second node; a second capacitor with a first terminal, that is connected to a third terminal of the first transistor, and a second terminal, that is connected to a second terminal of the second transistor; a third capacitor with a first terminal, that is connected to a first terminal of the first transistor, and a second terminal, that is connected to the first node; a fourth capacitor with a first terminal, that is connected to a second terminal of the first transistor, and a second terminal, that is connected to a second terminal of the second transistor; and a ground terminal that is connected to the second terminal of the second transistor; wherein the first terminal of the first transistor is connected to the current source; wherein the bulk of the first transistor is connected to the first terminal of the first transistor; and wherein the bulk of the second transistor is connected to the second terminal of the second transistor.

Preferably, the first transistor and second transistor are MOSFETs.

Preferably: the first terminal of the first transistor is a source terminal; the second terminal of the first transistor is a drain terminal; the third terminal of the first transistor is a gate terminal; the first terminal of the second transistor is a drain terminal; the second terminal of the second transistor is a source terminal; and the third terminal of the second transistor is a gate terminal.

Preferably, the first transistor and second transistor are BJTs.

Preferably, one or more of the connections are indirect connections and comprise one or more other components, such as resistors.

According to a fourth aspect of the invention, there is provided a crystal oscillator comprising the circuit according to the third aspect; and a crystal.

BRIEF DESCRIPTION OF THE SEVERAL VIEWS OF THE DRAWINGS

List of Figures

DETAILED DESCRIPTION OF THE INVENTION

Description of Embodiments

Embodiments provide a new oscillator design that provides improved performance over known oscillator designs with similar cost and/or complexity. Embodiments are particularly appropriate for use in TCXOs and low-to-medium performance OCXOs, as well as SXO, SPXOs and VCXOs.

The oscillator designs according to embodiments improve the performance of the amplifier circuit that maintains the oscillation. Characteristics of embodiments include one or more of the circuitry being semiconductor based, the use of standard CMOS circuitry, the components being integrated, the oscillator design being compact and the power consumption being low.

The circuitry according to embodiments improves on known techniques by providing circuitry that maintains a relatively constant mean voltage for the oscillator regardless of oscillation amplitude and providing additional voltage dependent capacitances with characteristics that compensate for variations in pre-existing parasitic capacitances and/or by biasing the oscillating waveform so that the average level of the oscillating waveform is more appropriately located between the power supply rails. Embodiments are particularly effective when the oscillator is based on the known-low-noise circuit design, commonly described as a current-starved oscillator, in which the oscillation level is limited by the available current.

Before embodiments are described in detail, a review of some background technology is provided in order aid the explanation of techniques according to embodiments.

Figure 1:
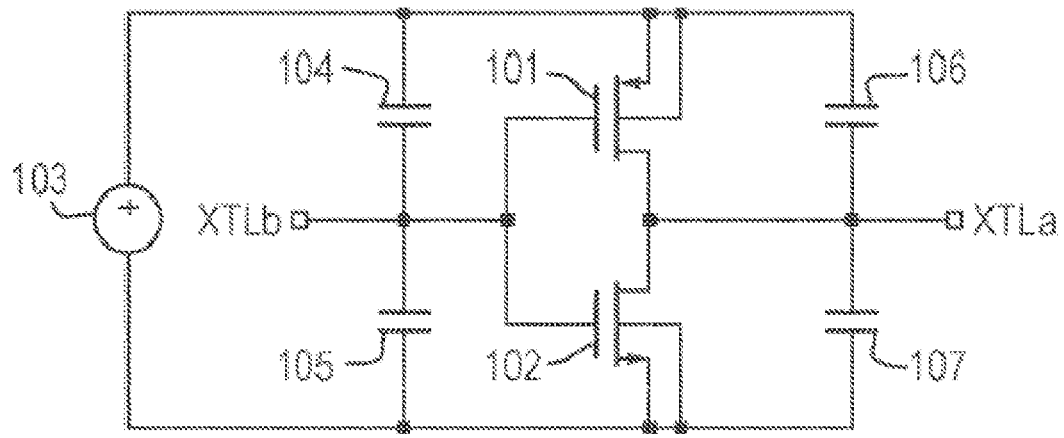
FIG. 1 shows a known amplification circuit of a crystal oscillator.

FIG. 1 shows a known design of integrated crystal oscillator circuit. The circuit comprises a n-type MOSFET 101, a p-type MOSFET 102, a first potential divider that is provided by capacitors 104 and 105, a second potential divider that is provided by capacitors 106 and 107, terminals XTLa and XTLb for connecting to a crystal and a DC power supply 103. The MOSFETs are complementary. When one of the MOSFETs is 'on' it is conducting from drain to source, or vice versa. When one of the MOSFETs is 'off' there is effectively an open circuit between the drain and source of the MOSFET. Terminal XTLb for connecting to the crystal is connected to common gate of the MOSFETs and terminal XTLa for connecting to the crystal is connected to common drain of the transistors.

The MOSFETs, capacitors and terminals for connecting to the crystal have been arranged in the Pierce configuration. The Pierce configuration is an implementation of a Colpitts oscillator.

The output from the oscillator can be taken from a number of locations in the circuit, such as one, or both, of the terminals XTLa and XTLb for connecting to the crystal.

A problem with the standard complementary CMOS oscillator as shown in FIG. 1 is that the oscillation gain does not reduce as the oscillation level, i.e. voltage level of the oscillation waveform (also referred to as the oscillation amplitude of the voltage), increases. The oscillator therefore drives until the source-drain of the MOSFETs becomes a relatively low impedance in part of the oscillation cycle. This limiting degrades the oscillator Q, which reduces the noise filtering capability of the oscillator and the oscillator becomes more noisy.

A further problem is that variations in MOSFET gain and crystal resistance change the oscillation level slightly, so that the level and duration of the low impedance state changes. This alters the effective load capacitance, so the frequency becomes directly dependent on the circuit conditions: low frequency (flicker) noise in any of the components is therefore directly converted to frequency noise.

Figure 2:
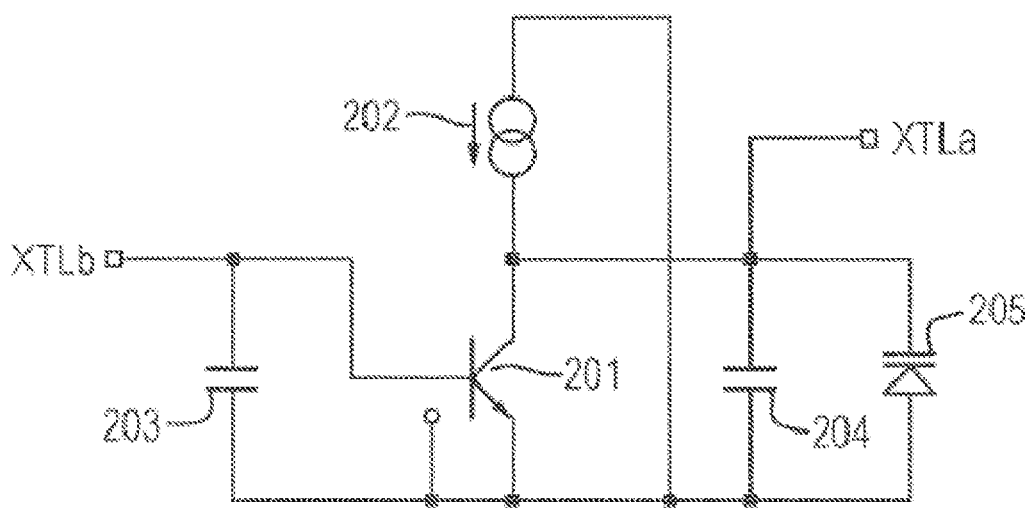
FIG. 2 shows a known amplification circuit of a crystal oscillator.

FIG. 2 shows another known design of integrated crystal oscillator circuit. This is a single-ended 'current-starved' oscillator that is also an implementation of a Colpitts oscillator.

The circuit comprises a BJT 201, a constant current source 202, capacitors 203 and 204 and terminals XTLa and XTLb for connecting to a crystal. Also shown on the right hand side of the circuit in FIG. 2 is a varactor 205. This is not a component that is provided in the circuit and instead represents voltage dependent parasitic capacitance effects that occur, as explained below.

The current-starved oscillator is typically run with current that is just insufficient to cause the collector-emitter voltage (or drain-source voltage for MOSFETs) to become low enough for the transistor output impedance to reduce. Consequently the major changes with crystal resistance and transistor gain are variation in the width of the current pulse that drives the oscillation, together with changes in the DC voltages for transistor flicker noise. Changes in the width of the current pulse do affect the oscillation frequency, but the effect is small in comparison with the other effects. Changes to the DC voltage, i.e. mean voltage, are a relatively minor problem with discrete transistors; however, with integrated circuits there are significant parasitic capacitances that are sensitive to the applied potential. The parasitic capacitances are illustrated by the varactor in FIG. 2. Consequently, high performance integrated circuit oscillators have generally used special-purpose low noise BiCMOS processes. However, this increases the silicon costs by more than a factor of two greater than that of standard CMOS circuitry.

Figure 3:
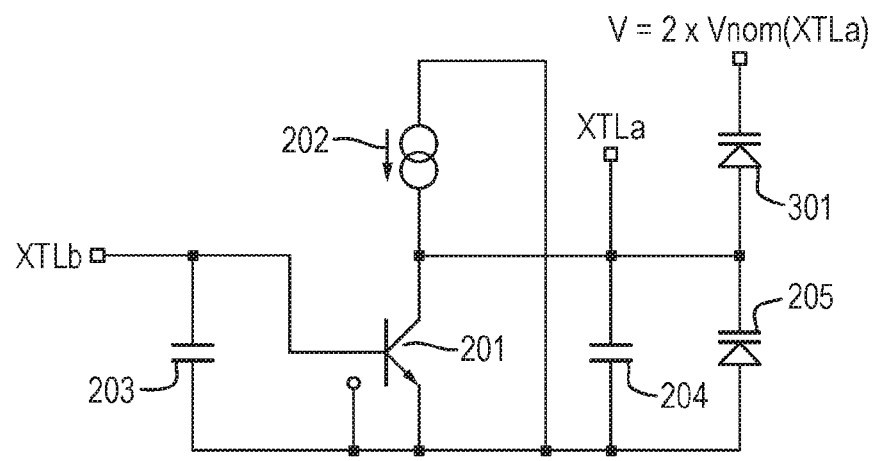
FIG. 3 is an amplification circuit according to a first embodiment.

FIG. 3 shows an improvement over the known technique of FIG. 2 according to a first embodiment.

According to the first embodiment, circuitry is provided that provides a voltage-dependent capacitor 301 that is connected such that it compensates for at least some of the effects of DC-induced variations in the parasitic capacitance 205 of the transistor 201.

As shown in FIG. 3, according to the first embodiment the circuit of FIG. 2 is modified so that it further comprises a device that has a variable capacitance 301. The variable capacitance 301 is a voltage dependent capacitance and the device may be a varactor or any other known device for providing a variable capacitance, such as a microelectromechanical system, MEM. In particular, the device may be a transistor and, as explained later, the use of a transistor to provide the variable capacitance is demonstrated in FIGS. 5 and 6. According to known techniques, the device may be supported by a bias circuit for providing the voltage across the device for generating a desired voltage dependent capacitance and also controlling the voltage dependent capacitance. In FIG. 3, a terminal of the variable capacitance 301 is shown as being held at a voltage, V, that is twice the value of a nominal voltage, Vnom. Vnom may be, for example, determined as the average value of the voltage at XTLa or another voltage. FIG. 3 shows an example of how the variable capacitance 301 may be biased according to embodiments. However, embodiments include other techniques for biasing the variable capacitance 301. In particular, the above-described terminal of the variable capacitance 301 is not restricted to being held at a voltage that is twice the value of the nominal voltage and embodiments include the terminal of the variable capacitance 301 alternatively being held at a higher, or lower, voltage.

The technique of the first embodiment is capable of reducing the sensitivity at a node, such as XTLa in FIG. 3, to small DC shifts. That is to say, when there is a change in the mean voltage at a node, such as XTLa in FIG. 3, that causes the intrinsic capacitance to the transistor 201 to change, the change in the mean voltage also results in a change of the voltage dependent capacitance that compensates for at least some of the effects of the change in the intrinsic capacitance of the transistor 201. The amount of change of the effective capacitance of the node caused by a change of the mean voltage at the node is therefore reduced. The effective capacitance at the node may therefore remain unchanged when there is a change in mean voltage at the node.

The first embodiment includes other designs of integrated amplifier circuits with a voltage dependent capacitance that provides the same advantage of the amount of change in effective capacitance at a node being reduced when there is a change in mean voltage, i.e. a DC shift, at the node.

One potential limitation of the arrangement according to the first embodiment is that the oscillation waveform cannot be symmetric about its average due to the implementation of the current starved oscillator only including a single transistor.

The method of capacitance compensation according to the first embodiment doubles the value of voltage-dependent capacitance and therefore the sensitivity to oscillation amplitude. However, a major strength of the current-starved circuit design is that the oscillation amplitude is relatively insensitive to the drive circuit's flicker noise, and the fluctuations in energy absorption in the crystal are associated with greater frequency shifts than will be seen from their effect on the oscillation.

Figure 4:
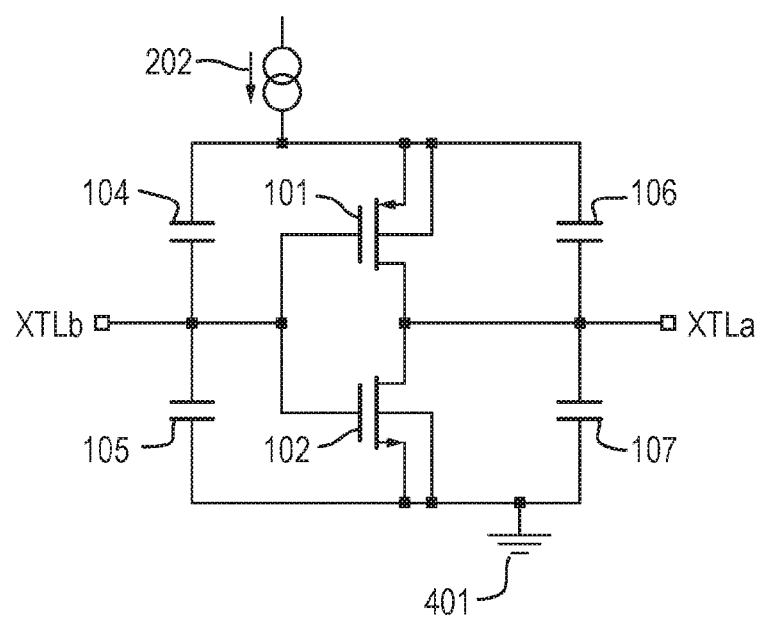
FIG. 4 is an amplification circuit according to a second embodiment.

A second embodiment of the invention is shown in FIG. 4 in which a current starved supply of bias current is used to restrict the oscillation amplitude.

The complementary drive arrangement is as described for FIG. 1. The circuit in FIG. 4 differs from that in FIG. 1 by further comprising the constant current source 202 and the ground terminal 401.

According to the second embodiment of the invention, a complementary drive arrangement is provided by MOSFETs 101 and 102. An advantage of the second embodiment is that the supply current, i.e. bias current, is reduced without a significant amount of additional circuitry being required. A difference between the second embodiment and the circuit in FIG. 1 is therefore that, in the second embodiment, the oscillation amplitude of the voltage (i.e. the amplitude of the AC component of the voltage) is restricted by the current starved supply of current. The oscillation amplitude of the voltage is therefore prevented from reaching the power supply voltages, i.e. hitting the rails.

The circuit design of the second embodiment advantageously has an oscillation waveform that is substantially symmetric about its average value. In addition, there is an increase in Q value due to the current starving. The available voltage is used more efficiently than with a single-ended version of the circuit that would require twice the current.

The second embodiment includes other designs of integrated amplifier circuits with a current starved supply of current that provides the same above-described advantages.

There are a number of limitations with the implementation as shown in FIG. 4. The mean voltages across the variable drain-bulk capacitances of 101 and 102 are dependent on the flicker performance of their respective transistors, so there is no capacitive compensation. In addition the effect of oscillation amplitude on forward voltage is the same for both devices without any compensation being applied. In addition, similar to a single-ended oscillator, there is significant second harmonic voltage across each of the parasitic capacitors.

Figure 5:
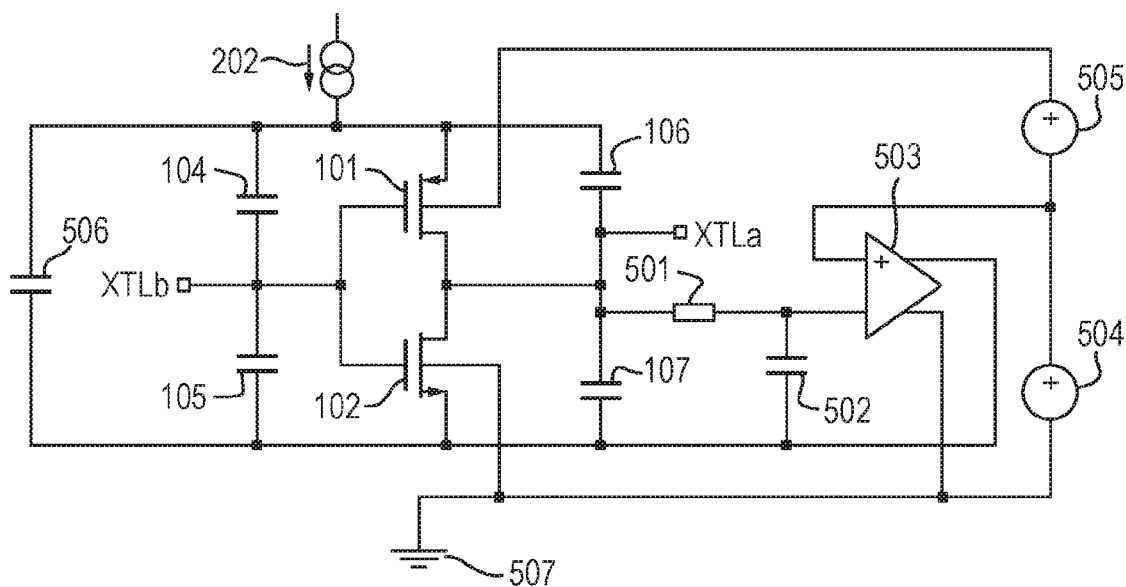
FIG. 5 is an amplification circuit according to a third embodiment.

A third embodiment of the invention is shown in FIG. 5. The third embodiment combines the advantages of the first and second embodiments in that both a voltage dependent capacitance is provided for compensating for the effects of mean voltages on intrinsic capacitances and the supply currents to the transistors are current starved so as to avoid problems caused by too great in increase in the oscillation amplitude.

The circuit design according to third embodiment of the invention improves on that of the second embodiment by introducing additional capacitance to reduce the second harmonic content and also by connecting and biasing the circuit components such that the parasitic capacitances are first-order invariant at the nominal bias point.

The additional capacitance for reducing the distortion voltage is 506 as shown in FIG. 5.

The value of the capacitor 506 is preferably not so large that the capacitor 506 introduces a decay time-constant that interacts with the amplitude modulation characteristic of the basic resonator-oscillator combination. Such a large capacitance value would initially introduce a noise peak and could eventually cause full-blown squegging. Further circuitry would therefore be required for damping out the squegging.

It should be noted that the provision of capacitor 506 shown in FIG. 5 for recovering the RF gain is a preferable feature according to the third embodiment and not an essential feature. The third embodiment also includes the same circuit as shown in FIG. 5 but without capacitor 506.

The third embodiment comprises an active bias circuit. An advantage of the active bias circuit is that it is arranged to maintain the oscillator waveform at the point where effective opposing gradients of the intrinsic drain to substrate capacitances of the transistors 101 and 102 have minimum sensitivity to the DC potential. This may be substantially at the mid-point, i.e. mid-level, of the positive and negative power supply rails. An additional advantage of the active bias circuit is that it is arranged to bias at least one of the drive MOSFETs in dependence on the voltage level of the oscillation waveform.

The active bias circuit is shown in the right part of FIG. 5. The components of the active bias circuit include an operational amplifier 503, a first DC power supply 504, a second DC power supply 505, a resistor 501 and a capacitor 502. The first and second DC power supplies are arranged in series with each other. The negative terminal of the first DC power supply 504 is connected to a ground terminal 507. The voltage at the mid-point of the two DC power supplies is a first DC voltage relative to the ground potential. The voltage at the positive terminal of the second DC power supply 505 is a second DC voltage relative to the ground potential. The potential difference across each of the first and second DC power supplies is preferably the same so that the first DC voltage is at the mid-point of the potential difference between the second DC voltage and the ground terminal.

The resistor 501 and capacitor 502 are connected to the inverting, i.e. negative, terminal of the operational amplifier 503 with negative feedback provided through the capacitor 502. The configuration of the resistor 501 and capacitor 502 around the operational amplifier 503 can be considered to be an integrator circuit. The non-inverting, i.e. positive, terminal of the operational amplifier is connected to the midpoint of the first and second DC power supplies and is at the first DC voltage.

As shown in FIG. 5, an output of the operational amplifier 503 is connected to the source of MOSFET 102. Although not shown in FIG. 5, a resistor may be provided between the output of the operational amplifier 503 and the source of MOSFET 102. An input to the active bias circuit is connected to the common drains of MOSFETs 101 and 102 as well as the terminal for connecting to the crystal, i.e. the oscillating waveform. Although not shown in FIG. 5, a resistor may be provided between the input to the active bias circuit and the common drains of MOSFETs 101 and 102 as well as the terminal for connecting to the crystal. Although not shown in FIG. 5, resistors and/or other components may be provided between the connections between the drains of MOSFETs 101 and 102 as well as the terminal for connecting to the crystal.

As shown in FIG. 5, the bulk of MOSFET 102 is connected to the ground terminal and the bulk of the other MOSFET 101 is connected to positive terminal of the second DC power supply, and is therefore at the second DC voltage. The active bias circuit therefore biases the bulks of each of MOSFET 101 and 102 so that the potential difference between the bulks is the second DC voltage, i.e. the power supply rail voltage, as defined by the first and second DC power supplies.

The non-inverting input of the operational amplifier is held at the first DC voltage. Due to the negative feedback configuration of the operational amplifier, the output of the operational amplifier is arranged to change so as to maintain both inputs of the operational amplifier at the same level. An advantageous property of this bias configuration is that the bias applied by the active bias circuit maintains the average value of the oscillator waveform substantially at the first DC voltage.

An additional advantage of the active bias circuit is that it is arranged to automatically bias at least one of the drive MOSFETs in dependence on the voltage level of the oscillation waveform. As illustrated in FIG. 5, the bulk of MOSFET 102 is held at the ground potential. The drain terminal of the MOSFET 102 is at the same potential as one of the terminals for connecting to the crystal and the input to the biasing circuit. The potential difference between the drain and bulk terminals of MOSFET 102 are therefore dependent on the oscillation waveform, i.e. the signal at the terminal connected to the crystal. The parasitic capacitances are dependent on this drain-bulk potential difference. The active bias circuit is arranged to compensate for this effect since the output of the active bias circuit is connected to the source of the MOSFET 102. The active bias circuit is therefore arranged to control the bulk-source potential difference of the MOSFET 102 in dependence on the drain-bulk potential difference of the MOSFET 102. This biasing of MOSFET 102 substantially compensates for the first-order voltage dependent parasitic capacitances.

Similarly, the bulk of the MOSFET 101 is biased at the second DC voltage level. The active bias circuit is controlled in dependence of the oscillator waveform so that the bulk-drain and source-bulk potential differences substantially reduce the effect of parasitic capacitances.

Preferably, the drain areas and peripheries of the transistors 101 and 102 are designed so that the trans-conductance, which is $$\frac{dI}{dV},$$

where I=current and V=voltage, is as well matched between the transistors as possible and also so that the gate-source capacitances, and all other contributors to the parasitic capacitances, are as similar as possible. This ensures that the variable capacitances have gradients that are equal and opposite magnitude around the DC potential at the mid-point of the oscillation.

Figure 6:
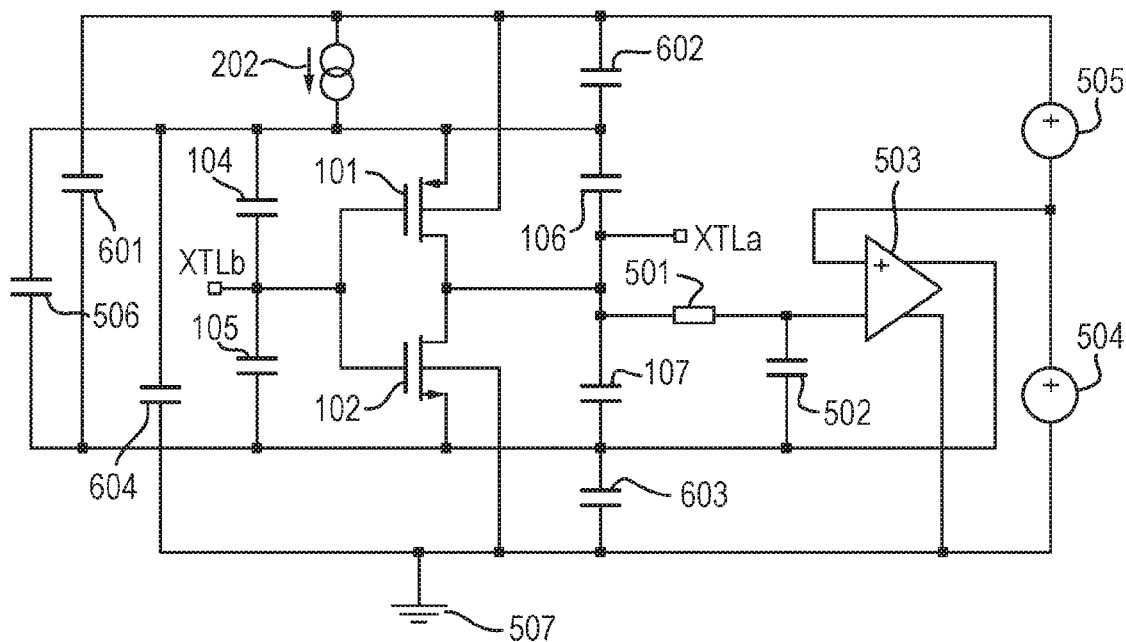
FIG. 6 is another amplification circuit according to a third embodiment.

FIG. 6 shows a modification of the third embodiment. The circuit in FIG. 6 is the same as that in FIG. 5 but comprises further capacitors for improving the stabilization of the circuit and the symmetry of the oscillator waveform within the power supply rails.

The circuit in FIG. 6 comprises all of the components of the circuit in FIG. 5. As shown in FIG. 6, a second terminal of the constant current source 202 is connected to the second DC power supply 505 and therefore held at the second DC voltage. Capacitor 601 is provided between the positive supply rail and the output of the active bias circuit. Capacitor 602 is provided between the positive supply rail and the source of MOSFET 101. Capacitor 603 is provided between the ground terminal and the output of the active bias circuit. Capacitor 604 is provided between the source of MOSFET 101 and the ground terminal.

The total headroom required in the circuits according to the third embodiment is the sum of the peak-to-peak voltage swing on the drains, the source-drain potential difference required to keep the MOSFETs in saturation, and the voltages required for the current source and for the output of the centering amplifier. This need not be significantly more than is required for a high-Q standard (single-ended) current starved oscillator. Advantageously, the push-pull drive of the complementary stage means that only half the drive current is required. Under suitable conditions, the use of the complementary current starved circuit is capable of reducing oscillator dissipation compared with other low-noise approaches.

The third embodiment includes other designs of integrated amplifier circuits that comprise components operating substantially as described above to provide some, or all, of the above-described advantages.

Figure 7:
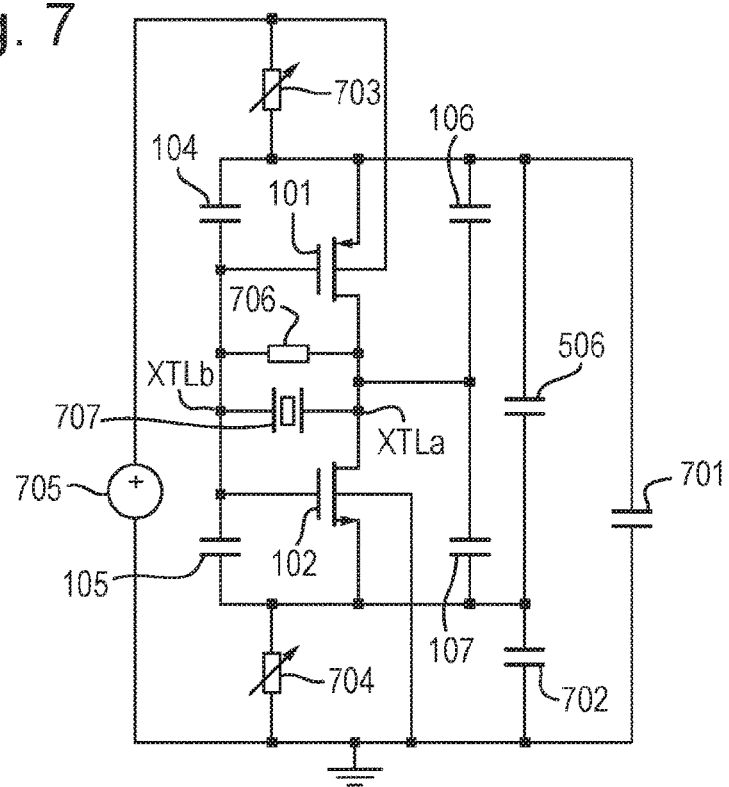
FIG. 7 is an amplification circuit according to a fourth embodiment.

A fourth embodiment of the invention is shown in FIG. 7. The circuits of the fourth embodiment are similar to the circuits of the third embodiment and equivalent arrangements of components are indicated using the same reference signs used for the third embodiment.

The circuits of the fourth embodiment comprise a complementary transistor drive arrangement, as already described for the second and third embodiments. The circuit is shown in FIG. 7 with a crystal 707 of the crystal oscillator provided across the terminals XTLa and XTLb. A resistor 706 may be provided in parallel with the crystal 707.

The capacitors 506, 701 and 702 are optional and the fourth embodiment includes circuits without one or more of these capacitors being provided. The capacitor 506 may provide the same advantages as the capacitor 506 as already described for the circuits of the third embodiment.

Any of the capacitors 506, 701 and 702 may have fixed values. However, the fourth embodiment includes any of the capacitors 506, 701 and 702 alternatively being provided by any type of tuneable capacitance, such as a digitally tuneable MEMs capacitor.

In the fourth embodiment, a DC power supply 705 is provided. As shown in FIG. 7, the bulk of transistor 101 may be connected to the positive terminal of the DC power supply 705 and the bulk of the transistor 102 may be connected to the negative terminal of the DC power supply 705. The negative terminal of the DC power supply 705 may be connected to ground.

Resistor 703 is provided between the source of the transistor 101 and the positive terminal of the DC power supply. Resistor 704 is provided between the source of the transistor 102 and the negative terminal of the DC power supply.

Resistors 703 and 704 are preferably both variable resistors. Resistors 703 and 704 may be digitally tuneable variable resistors, such as MEMs resistors. When the resistors 703 and 704 are variable resistors, their resistances can be controlled as appropriate for providing a desired oscillation level and center voltage during operation. The values of the resistors 703 and 704 may be temporarily reduced when the circuit is being started-up.

The circuits of the fourth embodiment may provide some, or all, of the previously described advantages as the circuits of the third embodiment.

Figure 8:
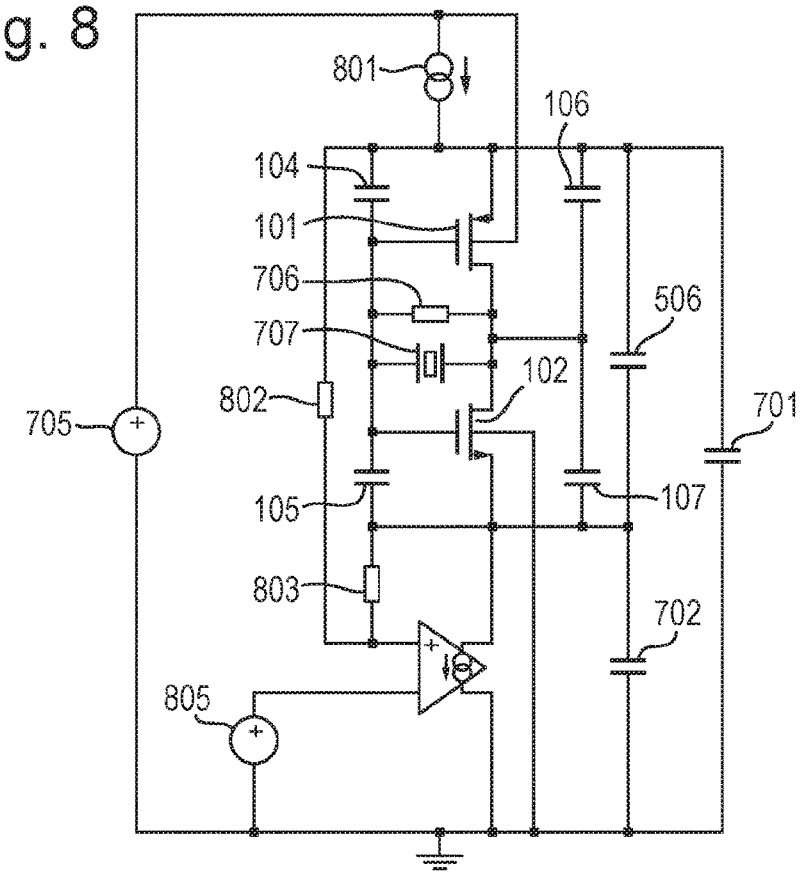
FIG. 8 is an amplification circuit according to a fifth embodiment.

A fifth embodiment of the invention is shown in FIG. 8. The circuits of the fifth embodiment also comprise a complementary transistor drive arrangement. The circuits of the fifth embodiment are similar to the circuits of the fourth embodiment and equivalent arrangements of components are indicated using the same reference signs as used for the fourth embodiment.

In the fifth embodiment, capacitors 506, 701 and 702 are optional and the fifth embodiment includes circuits without one or more of these capacitors being provided. The capacitor 506 may provide the same advantages as the capacitor 506 as described for the circuits of the third embodiment.

Any of the capacitors 506, 701 and 702 may have fixed values. However, the fifth embodiment includes any of the capacitors 506, 701 and 702 alternatively being provided by any type of tuneable capacitance, such as a digitally tuneable MEMs capacitor.

In the fifth embodiment, a DC power supply 705 is provided. As shown in FIG. 8, the bulk of transistor 101 may be connected to the positive terminal of the DC power supply 705 and the bulk of the transistor 102 may be connected to the negative terminal of the DC power supply 705. The negative terminal of the DC power supply 705 may be connected to ground.

The fifth embodiment comprises a first current source 801 and a second current source 804.

The first current source 801 is preferably a variable current source, such as a digitally controlled current source.

The second current source 804 is preferably a voltage controlled current source (VCSS) 804. A first terminal of the second current source 804 is connected to the source of the transistor 102. A second terminal of the second current source 804 is connected to the negative terminal of the DC power supply 705.

The source of transistor 101 may be connected to an input of the second current source 804 via the resistor 802 and the source of transistor 102 may be connected to the same input of the second current source 804 via the resistor 803.

The second current source may provide improved current control and also more effective use of the available headroom.

The fifth embodiment also comprises DC voltage source 805 that is preferably a variable voltage source. A first terminal of the voltage source 805 may be connected to an input of the second current source 804. A second terminal of the voltage source 805 may be connected to the negative terminal of the DC power supply 705. The voltage source 805 may be a digitally controlled variable voltage source. When the voltage source 805 is a variable voltage source, the output DC voltage of the voltage source 805 may be controlled so as to minimize the sensitivity to flicker noise.

The first and/or second current sources can be controlled as appropriate for providing a desired oscillation level. The current of the first and/or second current source may be temporarily set to a high value when the circuit is being started-up and then reduced when oscillation has started.

In an alternative implementation of the fifth embodiment, a load resistor may be used instead of the second current source 804.

The circuits of the fifth embodiment may provide some, or all, of the previously described advantages as the circuits of the third and fourth embodiments.

Embodiments include a number of modifications and variations to the techniques as described above.

In the second and third embodiments, the active bias circuit matches the rate-of-change of the drain-substrate capacitance of the p-type MOSFET 102 with that of the n-type MOSFET 101. The active bias circuit improves performance by substantially reducing errors caused by the parasitic effects. However, due to process variations, an exact match between different device types may not be consistently achieved. In order to improve the matching, the active bias circuit preferably comprises additional circuitry for changing the first DC voltage so that it is not at the mid-level of the power supply rail.

Another advantage of controlling the first DC voltage so that it is offset from the mid-level of the power supply rail when the amplifier is operated is that this provides more headroom for the current source than for the op-amp drive.

In FIGS. 5 and 6, a first DC power supply and a second DC power supply provide DC potentials. However, embodiments include any other technique for providing the DC potentials. For example, a potential divider arrangement could alternatively be used in which the first DC power supply is replaced by a first resistor and the second DC power supply is replaced by a second resistor. At least one of the first and second resistor could be a variable resistor. A single DC power supply would be provided in parallel to the series connection of the first and second resistor. Other techniques for providing the DC potentials include the use of diodes or MOS voltage sources.

Preferable further techniques according to the third, fourth and fifth embodiments include configuring the circuit so that there is a mismatch of the source-drain areas and peripheries and alternatively, or additionally, adjusting the bulk bias of each of the n-type MOSFET 101 and p-type MOSFET 102 so that they are centered in the DC-insensitive range.

The circuits as shown in FIGS. 1 to 8 are all simplified in that they show only the key components in the oscillator circuitry. The differences between the circuit configurations according to embodiments and known techniques are thereby clearly shown. A person skilled the art of semiconductor oscillator design would understand that an actual implementation of the oscillator circuits may further comprise standard arrangements of components for supporting the devices that are not shown in FIGS. 1 to 8. In particular, DC feedback arrangements may be provided even though these are not shown in the figures. The circuits are also shown with gates, and other terminals, connected to each-other. Embodiments also include there being intermediate components, such as resistors, between the connections. Embodiments also include the circuits in FIGS. 3 to 8 further comprising additional circuitry. For example, circuitry may be included for ensuring DC separation of the gates, and other terminals, for example to improve the use of the headroom. In particular, embodiments include the provision of a passive bias circuit that may have one or more resistors biasing the operating voltages and currents. The multiple ways in which these, and other modifications, to the circuits in FIGS. 3 to 8 could be made would be apparent to a person skilled in the art.

In addition, although terminals are shown and described as being connected to each other, the connections may be direct connections or indirect connections. Indirect connections include there being any of stripline, micro-stripline, vias, resistors, inductors and capacitors between the connected terminals in accordance with known techniques. The additional circuitry present with the indirect connections does not substantially contribute to the properties of the oscillator as defined by the crystal properties and capacitive bridges.

The circuits in FIGS. 4 to 8 are shown and described with a common connection between the drains of the MOSFETs. However, embodiments also include the MOSFETs alternatively being arranged with a common connection between the sources of the MOSFETs. The bias circuitry would then be configured to match the rate of change of the source capacitance instead of the drain capacitance.

Embodiments include the circuits having a single-ended connection to a crystal instead of two terminals for connecting to a crystal.

In FIGS. 5 and 6, the input to the active bias circuit is at the connection XTLa to the crystal. Embodiments include the input alternatively, or additionally, being at the connection XTLb to the crystal and/or at other locations in the circuit.

Embodiments also include the output of the active bias circuit being connected to different locations in the circuit so long as appropriate biasing of the MOSFETs 101 and 102 is provided.

Embodiments also include the use of more than two MOSFETs in the amplification circuit in accordance with known MOSFET implementations.

The MOSFETs are preferably designed so that the interaction between the oscillation and the second-harmonic, that is inevitably generated between the supply rails (i.e. the sources in the configuration of FIGS. 5, 6, 7 and 8), is minimized. The symmetry between the characteristics of the n-channel and p-channel devices helps to reduce resulting negative effects. The gate-input capacitances are preferably equalized by controlling the gate area and the gm values through the important range of bias levels and controlling the aspect ratio (W/L). This MOSFET design results in the p-type MOSFET devices having shorter and wider gates than the n-type MOSFET devices and therefore larger drain areas. The areas and the peripheries of the n-type MOSFET source-drains are preferably expanded sufficiently so that their effective rate of change of capacitance with DC bias matches that of the p-type MOSFET under nominal operating conditions. As explained above, the nominal operating condition may be at the mid-level of the power supply rails but in some applications the nominal operating condition may be offset from mid-level of the power supply rails.

Embodiments also include providing equal capacitances in the transistors 101 and 102 so that the oscillator is insensitive to the DC effects of varying the DC offset (due to flicker noise) and still biased at the center of the available voltage supply. Given that the lower bound on one of the capacitors is set by the PMOS (i.e. p-channel) device, it can be preferable to use an smaller source and/or drain with the n-channel device that P-channel device.

Although the circuits according embodiments have been shown with either MOSFETs or BJTs, embodiments include all of the MOSFET implementations alternatively being provided by BJTs and all of the BJT implementations alternatively being provided by MOSFETs.

Embodiments also include the variation of all shown and described implementations with n-type MOSFETs alternatively being provided by p-type MOSFETs, and vice-versa. Embodiments also include the variation of all shown and described implementations with npn BJTs alternatively being provided by pnp BJTs, and vice-versa.

While specific embodiments of the invention have been described above, it will be appreciated that embodiments of the invention may be practiced otherwise than as described. In particular, whereas the operation has been described with regard to MOSFETs with AC-grounded sources (commonly described as a Pierce circuit), the arrangements can be adapted to circuits where the drain is grounded. Further, the MOSFET can be replaced by a bipolar devices if costs are acceptable and performance requirements make this desirable.

Embodiments also include the following numbered clauses:

1. An integrated circuit amplifier for use in a crystal oscillator, the integrated circuit amplifier comprising:
   a first transistor;
   a second transistor, wherein the second transistor is complementary to the first transistor;
   a node that is connected to both a terminal of the first transistor and a terminal of the second transistor;
   a current source arranged to supply at least part of a bias current to at least one of the first and second transistors, wherein the oscillation amplitude of the voltage at the node is dependent on said bias current;
   wherein the integrated circuit amplifier is configured so that, in use, an oscillation amplitude of the voltage at the node is restricted due to the supply of said bias current being current starved.

2. The integrated circuit amplifier according to clause 1, wherein the integrated circuit amplifier is configured so that the first and second transistors are in a configuration of the extended Colpitts family; and/or, optionally, the transistors are arranged in an inverter configuration, such as a Pierce configuration.

3. The integrated circuit amplifier according to clause 1 or 2, wherein the transistors are designed so that the change gain of the first transistor with respect to the oscillation current and the change gain of the second transistor with respect to the oscillation current have substantially the same magnitude and are the inverse of each other.

4. The integrated circuit amplifier according to any of clauses 1 to 3, wherein the transistors and/or related bias circuits are designed so that, in use, variation of at least one of the bias voltages causes changes in the parasitic capacitances that are of substantially the same magnitude and opposite polarity.

5. The integrated circuit amplifier according to any of clauses 1 to 4, wherein either:
   the first transistor and second transistor are BJTs and arranged in a common-collector configuration; or
   the first transistor and second transistor are MOSFETs and arranged in a common-drain configuration.

6. The integrated circuit amplifier according to any of clauses 1 to 4, wherein either:
   the first transistor and second transistor are BJTs and arranged in a common-base configuration; or
   the first transistor and second transistor are MOSFETs and arranged in a common-gate configuration.

7. The integrated circuit amplifier according to any of clauses 1 to 4, wherein either:
   the first transistor and second transistor are BJTs and arranged in a common-emitter configuration; or
   the first transistor and second transistor are MOSFETs and arranged in a common-source configuration.

8. The integrated circuit amplifier according to any of clauses 1 to 7, further comprising a passive bias circuit;

wherein, in use, the operating voltages and/or currents are dependent on the passive bias circuit.
9. The integrated circuit amplifier according to any of clauses 1 to 8, further comprising an active bias circuit; wherein, in use, the active bias circuit is configured to control the mean voltage at the node of the integrated circuit amplifier.
10. The integrated circuit amplifier according to any of clauses 1 to 7, wherein the node is a first node that is, or is connected to, a first output terminal for connecting to the crystal of a crystal oscillator, and the first node is connected to a second terminal of the first transistor, wherein the integrated circuit amplifier further comprises:
a second node that is, or is connected to, a second output terminal for connecting to the crystal of a crystal oscillator, and the second node is connected to a third terminal of the first transistor;
a first capacitor with a first terminal, that is connected to a first terminal of the first transistor, and a second terminal, that is connected to the second node;
a second capacitor with a first terminal, that is connected to a third terminal of the first transistor, and a second terminal, that is connected to a second terminal of the second transistor;
a third capacitor with a first terminal, that is connected to a first terminal of the first transistor, and a second terminal, that is connected to the first node;
a fourth capacitor with a first terminal, that is connected to a second terminal of the first transistor, and a second terminal, that is connected to a second terminal of the second transistor; and
a ground terminal that is connected to the second terminal of the second transistor;
wherein the first terminal of the first transistor is connected to the current source;
wherein the bulk of the first transistor is connected to the first terminal of the first transistor; and
wherein the bulk of the second transistor is connected to the second terminal of the second transistor.
11. The integrated circuit amplifier according to any of clauses 1 to 10, wherein the first transistor and second transistor are MOSFETs.
12. The integrated circuit amplifier according to clause 11, wherein:
the first terminal of the first transistor is a source terminal;
the second terminal of the first transistor is a drain terminal;
the third terminal of the first transistor is a gate terminal;
the first terminal of the second transistor is a drain terminal;
the second terminal of the second transistor is a source terminal; and
the third terminal of the second transistor is a gate terminal.
13. The integrated circuit amplifier according to any of clauses 1 to 10, wherein the first transistor and second transistor are BJTs.
14. The integrated circuit amplifier according to any preceding clause, wherein one or more of the connections are indirect connections and comprise one or more other components, such as resistors.
15. A crystal oscillator comprising the circuit according to any preceding clause; and a crystal.

The above-description of embodiments are intended to be illustrative, not limiting. Thus it will be apparent to one skilled in the art that modifications may be made to the invention as described without departing from the spirit and scope of the claims set out below.

I claim:
1. An integrated circuit amplifier for use in a crystal oscillator, the integrated circuit amplifier comprising:
a transistor;
a voltage dependent capacitance circuit, wherein the voltage dependent capacitance circuit comprises a device with a voltage dependent capacitance and a bias circuit of the voltage dependent capacitance; and
a node;
wherein the node is connected to a terminal of the transistor and the integrated circuit amplifier is configured such that an intrinsic capacitance of the transistor is dependent on the mean voltage at the node;
wherein the node is also connected to a terminal of the voltage dependent capacitance circuit and the integrated circuit amplifier is configured such that an effective capacitance of the node is dependent on both the intrinsic capacitance of the transistor and the voltage dependent capacitance of said device;
wherein, in use, the voltage dependent capacitance circuit reduces the amount of change of the effective capacitance of the node when the mean voltage at the node changes;
wherein the node is, or is connected to, an output terminal of the integrated circuit amplifier, wherein the output terminal arranged to provide a connection to a crystal of a crystal oscillator;
wherein the transistor is a first transistor, the node is connected to a first terminal of the first transistor, and the integrated circuit amplifier further comprises:
a current source;
a second transistor, wherein a first terminal of the second transistor is connected to a terminal of the current source, a second terminal of the second transistor is connected to the node and a third terminal of the second transistor is connected to a third terminal of the first transistor;
a first capacitor with a first terminal connected to the third terminal of the first transistor and a second terminal connected to the terminal of the current source;
a second capacitor with a first terminal connected to the third terminal of the first transistor and a second terminal connected to the second terminal of the first transistor;
a second output terminal of the integrated circuit amplifier, wherein the second output terminal is arranged to provide a connection to a crystal of a crystal oscillator, and the second output terminal is connected to the third terminal of the first transistor;
a third capacitor with a first terminal connected to the first terminal of the second transistor and a second terminal connected to the node; and
a fourth capacitor with a first terminal connected to the node and a second terminal connected to the second terminal of the first transistor;
wherein said connection between the node and the voltage dependent capacitance circuit is a connection to an input of the voltage dependent capacitance circuit, and an output of the voltage dependent capacitance circuit is connected to the second terminal of the first transistor;

wherein the bulk of the first transistor is connected to a ground terminal;

wherein the bulk of the second transistor is biased by a DC voltage relative to the ground terminal; and wherein the integrated circuit amplifier optionally further comprises a fifth capacitor, wherein a first terminal of the fifth capacitor is connected to a first terminal of the second transistor, and a second terminal of the fifth capacitor is connected to the second terminal of the first transistor.

2. The integrated circuit amplifier according to claim 1, wherein the bias circuit is arranged to control the voltage dependent capacitance of said device in dependence on the mean voltage at the node.

3. The integrated circuit amplifier according to claim 1, wherein the device with a voltage dependent capacitance is a varactor or a transistor.

4. The integrated circuit amplifier according to claim 1, wherein the device with a voltage dependent capacitance is any device for providing a voltage dependent capacitance.

5. The integrated circuit amplifier according to claim 1, wherein the bias circuit is arranged to control the voltage dependent capacitance of the device such that, in use, the voltage dependent capacitance of the device substantially minimises the amount of change of the effective capacitance of the node when the mean voltage at the node changes.

6. The integrated circuit amplifier according to claim 1, wherein the integrated circuit amplifier is configured to supply a bias current to the transistor and, in use, an oscillation amplitude of the voltage at the node is restricted due to the supply of said bias current being current starved.

7. The integrated circuit amplifier according to claim 1, wherein the node is connected to a first terminal of the transistor and the integrated circuit amplifier further comprises:
    a current source with a first terminal connected to the node and a second terminal connected to a second terminal of the transistor;
    a first capacitor with a first terminal connected to a third terminal of the transistor and a second terminal connected to the second terminal of the transistor; and
    a second capacitor with a first terminal connected to the node and a second terminal connected to the second terminal of the transistor;
    wherein the third terminal of the transistor is, or is connected to, a second output terminal of the integrated circuit amplifier, wherein the second output terminal arranged to provide a connection to a crystal of a crystal oscillator.

8. The integrated circuit amplifier according to claim 7, wherein the transistor is a MOSFET.

9. The integrated circuit amplifier according to claim 8, wherein:
    the first terminal of the transistor is the drain terminal of the transistor;
    the second terminal of the transistor is the source terminal of the transistor; and
    the third terminal of the transistor is the gate terminal of the transistor.

10. The integrated circuit amplifier according to claim 1, wherein the transistor is a BJT.

11. The integrated circuit amplifier according to claim 10, wherein:
    a first terminal of the transistor is the collector terminal of the transistor;
    a second terminal of the transistor is the emitter terminal of the transistor; and
    a third terminal of the transistor is the base terminal of the transistor.

12. The integrated circuit amplifier claim 1, wherein the first transistor and second transistor are arranged in a complementary configuration.

13. The integrated circuit amplifier claim 1, wherein the first transistor and second transistor are MOSFETs.

14. The integrated circuit amplifier claim 13, wherein:
    the first terminal of the first transistor is a drain terminal;
    the second terminal of the first transistor is a source terminal;
    the third terminal of the first transistor is a gate terminal;
    the first terminal of the second transistor is a source terminal;
    the second terminal of the second transistor is a drain terminal; and
    the third terminal of the second transistor is a gate terminal.

15. The integrated circuit amplifier claim 1, wherein the first transistor and second transistor are BJTs.

16. The integrated circuit amplifier claim 1, wherein one or more of the connections are indirect connections and comprise one or more other components.

17. A crystal oscillator comprising the circuit claim 1; and a crystal.

18. An integrated circuit amplifier for use in a crystal oscillator, the integrated circuit amplifier comprising:
    a transistor;
    a voltage dependent capacitance circuit, wherein the voltage dependent capacitance circuit comprises a device with a voltage dependent capacitance and a bias circuit of the voltage dependent capacitance; and
    a node;
    wherein the node is connected to a terminal of the transistor and the integrated circuit amplifier is configured such that an intrinsic capacitance of the transistor is dependent on the mean voltage at the node;
    wherein the node is also connected to a terminal of the voltage dependent capacitance circuit and the integrated circuit amplifier is configured such that an effective capacitance of the node is dependent on both the intrinsic capacitance of the transistor and the voltage dependent capacitance of said device;
    wherein, in use, the voltage dependent capacitance circuit reduces the amount of change of the effective capacitance of the node when the mean voltage at the node changes;
    wherein the node is, or is connected to, an output terminal of the integrated circuit amplifier, wherein the output terminal arranged to provide a connection to a crystal of a crystal oscillator;
    wherein the transistor is a first transistor, the node is connected to a first terminal of the first transistor, and the integrated circuit amplifier further comprises:
    a DC power supply with a positive terminal and a negative terminal;
    a first resistor with a first terminal and a second terminal, wherein the first terminal of the first resistor is connected to the positive terminal of the DC power supply, wherein the first resistor is optionally a variable resistor;
    a second resistor with a first terminal and a second terminal, wherein the first terminal of the second resistor is connected to a second terminal of the first transistor and the second terminal of the second resistor is connected to the negative terminal of the DC power supply, wherein the second resistor is optionally a variable resistor;

a second transistor, wherein a first terminal of the second transistor is connected to the second terminal of the first resistor, a second terminal of the second transistor is connected to the node and a third terminal of the second transistor is connected to a third terminal of the first transistor;

a first capacitor with a first terminal connected to the third terminal of the first transistor and a second terminal connected to the second terminal of the first resistor;

a second capacitor with a first terminal connected to the third terminal of the first transistor and a second terminal connected to the second terminal of the first transistor;

a second output terminal of the integrated circuit amplifier, wherein the second output terminal is arranged to provide a connection to a crystal of a crystal oscillator, and the second output terminal is connected to the third terminal of the first transistor;

a third capacitor with a first terminal connected to the first terminal of the second transistor and a second terminal connected to the node; and a fourth capacitor with a first terminal connected to the node and a second terminal connected to the second terminal of the first transistor;

wherein the bulk of the first transistor is connected to the negative terminal of the DC power supply; and wherein the bulk of the second transistor is connected to the positive terminal of the DC power supply.

19. The integrated circuit amplifier claim 18, further comprising one or more of:

a third resistor with a first terminal connected to the node and a second terminal connected to the second output terminal;

a capacitor connected between the second terminal of the first transistor and the negative terminal of the DC power supply, wherein the capacitor is optionally a tuneable capacitor;

a capacitor connected between the first terminal of the second transistor and the negative terminal of the DC power supply, wherein the capacitor is optionally a tuneable capacitor; and a capacitor connected between a first terminal of the second transistor and the second terminal of the first transistor, wherein the capacitor is optionally a tuneable capacitor.

20. An integrated circuit amplifier for use in a crystal oscillator, the integrated circuit amplifier comprising:

a transistor;

a voltage dependent capacitance circuit, wherein the voltage dependent capacitance circuit comprises a device with a voltage dependent capacitance and a bias circuit of the voltage dependent capacitance; and a node;

wherein the node is connected to a terminal of the transistor and the integrated circuit amplifier is configured such that an intrinsic capacitance of the transistor is dependent on the mean voltage at the node;

wherein the node is also connected to a terminal of the voltage dependent capacitance circuit and the integrated circuit amplifier is configured such that an effective capacitance of the node is dependent on both the intrinsic capacitance of the transistor and the voltage dependent capacitance of said device;

wherein, in use, the voltage dependent capacitance circuit reduces the amount of change of the effective capacitance of the node when the mean voltage at the node changes;

wherein the node is, or is connected to, an output terminal of the integrated circuit amplifier, wherein the output terminal arranged to provide a connection to a crystal of a crystal oscillator;

wherein the transistor is a first transistor, the node is connected to a first terminal of the first transistor, and the integrated circuit amplifier further comprises:

a DC power supply with a positive terminal and a negative terminal;

a first current source with a first terminal connected to the positive terminal of the DC power supply;

a second current source with a first terminal connected to a second terminal of the first transistor and a second terminal connected to the negative terminal of the DC power supply;

a second transistor, wherein a first terminal of the second transistor is connected to a second terminal of the first current source, a second terminal of the second transistor is connected to the node and a third terminal of the second transistor is connected to a third terminal of the first transistor;

a first capacitor with a first terminal connected to the third terminal of the first transistor and a second terminal connected to the second terminal of the first current source;

a second capacitor with a first terminal connected to the third terminal of the first transistor and a second terminal connected to the second terminal of the first transistor;

a second output terminal of the integrated circuit amplifier, wherein the second output terminal is arranged to provide a connection to a crystal of a crystal oscillator, and the second output terminal is connected to the third terminal of the first transistor;

a third capacitor with a first terminal connected to the first terminal of the second transistor and a second terminal connected to the node; and a fourth capacitor with a first terminal connected to the node and a second terminal connected to the second terminal of the first transistor;

wherein the bulk of the first transistor is connected to the negative terminal of the DC power supply; and wherein the bulk of the second transistor is connected to the positive terminal of the DC power supply.

* * * * *